United States Patent
Gobert et al.

(10) Patent No.: US 6,925,118 B1
(45) Date of Patent: Aug. 2, 2005

(54) PROCESSING OF DATA IN A TEMPORAL SERIES OF STEPS

(75) Inventors: Jean Gobert, Maisons-Alfort (FR); Thomas Dombek, La Varenne St. Hilaire (FR)

(73) Assignee: Koninklijke Philips Electronics N.V., Eindhoven (NL)

(*) Notice: Subject to any disclaimer, the term of this patent is extended or adjusted under 35 U.S.C. 154(b) by 644 days.

(21) Appl. No.: 09/942,017

(22) Filed: Aug. 29, 2001

(30) Foreign Application Priority Data

Aug. 31, 2000 (FR) .......................................... 00 11145

(51) Int. Cl.$^7$ ................................................ H04N 7/12
(52) U.S. Cl. ............................ 375/240.02; 375/240.26
(58) Field of Search ........................ 375/240.02, 240.24, 375/240.1, 240.26; 382/234, 237, 247; 348/671, 425.1; 386/109, 111

(56) References Cited

U.S. PATENT DOCUMENTS

| | | | | |
|---|---|---|---|---|
| 5,790,196 A | * | 8/1998 | Sun et al. | 375/240.05 |
| 5,946,043 A | * | 8/1999 | Lee et al. | 375/240.24 |
| 6,154,570 A | * | 11/2000 | Boon | 382/236 |
| 6,493,386 B1 | * | 12/2002 | Vetro et al. | 375/240.1 |
| 6,542,545 B1 | * | 4/2003 | Vetro et al. | 375/240.08 |
| 6,574,279 B1 | * | 6/2003 | Vetro et al. | 375/240.08 |

OTHER PUBLICATIONS

Brady, N., "MPEG–4 standardized methods for the compression of arbitrarily shaped video objects", IEEE Transactions on Circuits and Systems for Video Technology, vol. 9, Iss. 8, pp. 1170–1189, Dec. 1999.*

* cited by examiner

Primary Examiner—Vu Le

(57) ABSTRACT

Data processing method is disclosed for processing a series of temporal processing steps [S]. The method comprises a processing step [S(n)] that generates a result [O(n)] on the basis of a set of results [O(n-1), O(n-2), ... O(n-m)] of certain preceding processing steps [S(n-1), S(n-2), ... S(n-m)], wherein the processing step [S] is performed in two sub-steps: a preparation sub-step [SA] and finishing sub-step [SB]. In the preparation sub-step [SA] an intermediate result [I] is determined on the basis of an incomplete set of results in which, at least the result of the nearest preceding processing step is missing. In the finishing sub-step [SB] the result [O] is determined on the basis of the intermediate result [I] and the result of the nearest preceding processing step and other results which are missing in the incomplete set of results.

4 Claims, 3 Drawing Sheets

US 6,925,118 B1

PROCESSING OF DATA IN A TEMPORAL SERIES OF STEPS

FIELD OF THE INVENTION

The invention relates to processing of data in a temporal series of steps. The invention can be used, for example, to effect shape decoding in accordance with the MPEG4 standard. (MPEG is the acronym for Motion Picture Experts Group.)

BACKGROUND OF THE INVENTION

A processing step can typically generate a result on the basis of a set of results of certain preceding processing steps. For example, a processing step numbered K may comprise the calculation of a result on the basis of the results of the last three preceding processing steps: the steps numbered K-1, K-2 and K-3, K being an integer greater than 3. Each processing step in such a data processing operation provides a new result. Indeed, it is as though there is a basket of results, which is gradually filled by carrying out the processing steps. In each processing step another result is added to certain results which are assumed to be already in the basket. This is a process of gradual growth. An example of such data processing is the contextual arithmetic decoding in accordance with the MPEG4 standard.

SUMMARY OF THE INVENTION

It is an object of the invention to enable implementations to be realized at comparatively low cost.

A processing of data in accordance with the invention is characterized as follows. Data processing is effected in a temporal series of processing steps. A processing step generates a result on the basis of a set of results of certain preceding processing steps. A processing step is carried out in two sub-steps: a preparation sub-step and a finishing sub-step. In the preparation sub-step an intermediate result is formed on the basis of an incomplete set of results from which, in comparison with the set of results on the basis of which the result is to be calculated, at least the result of the nearest preceding processing step is missing. In the finishing sub-step the result is determined on the basis of the intermediate result and of the result of the nearest preceding processing step and other results which are missing in the incomplete set of results, if any.

The invention takes the following aspects into consideration. A processing step can only produce a result if the preceding steps have already been carried out. Let it be assumed, for example, that a processing step numbered K consists in calculating a result on the basis of the results of preceding processing steps numbered K-1, K-2 and K-3. The result of the processing step numbered K-1 should therefore be available for calculating the result of the processing step numbered K. There will not be a problem if the processing step numbered K is not started until the processing step K-1 has been completed. Therefore, the simplest and most logical procedure seems to perform the processing steps sequentially.

In general, data processing should be effected in a certain time interval. For example, in an MPEG-4 decoding system for real-time display the shape decoding should be completed prior to certain subsequent steps of texture decoding and the display of the image. In principle, it is possible to effect data processing in the desired time interval by the use of sufficiently fast circuits. Let it be assumed, for example, that Tmax is the time interval in which a series of N processing steps should be carried out, N being an integer. If the processing steps are performed sequentially, the circuits should perform a processing step in a time interval Tmax divided by N. If the time interval Tmax is comparatively short and N is comparatively large the circuits must be relatively fast. This is the case, for example, with the shape decoding in accordance with the MPEG4 standard.

According to the invention, a processing step is performed in two sub-steps: the preparation sub-step and the finishing sub-step described hereinbefore. The preparation sub-step of a given processing step does not depend on the preceding processing step. Consequently, the preparation sub-step of a given processing step can be performed in parallel with the finishing sub-step of the preceding processing step. Thus, the invention makes it possible to execute processing steps in parallel: at a given instant it is possible to work on a plurality of processing steps. For a given time interval for the execution of a series of processing steps there is consequently more time for carrying out a processing step in accordance with the invention than in the case of an implementation where the processing steps are performed sequentially. The invention consequently makes it possible to have implementations employing less rapid circuits. In general, it holds that a circuit is cheaper as it is less rapid. Thus, the invention enables implementations to be realized at comparatively low cost.

These as well as other aspects of the invention will be described in more detail with reference to the following Figures.

EMBODIMENTS OF THE INVENTION

The following remarks relate to the reference signs. Similar entities bear identical reference letters in all the Figures. A plurality of similar entities may appear in a single Figure. In that case a numeral or a suffix is suffixed to the reference letters in order to distinguish between similar entities. The numeral or suffix may be omitted where appropriate. This applies both to the description and to the Claims.

Figure 1:
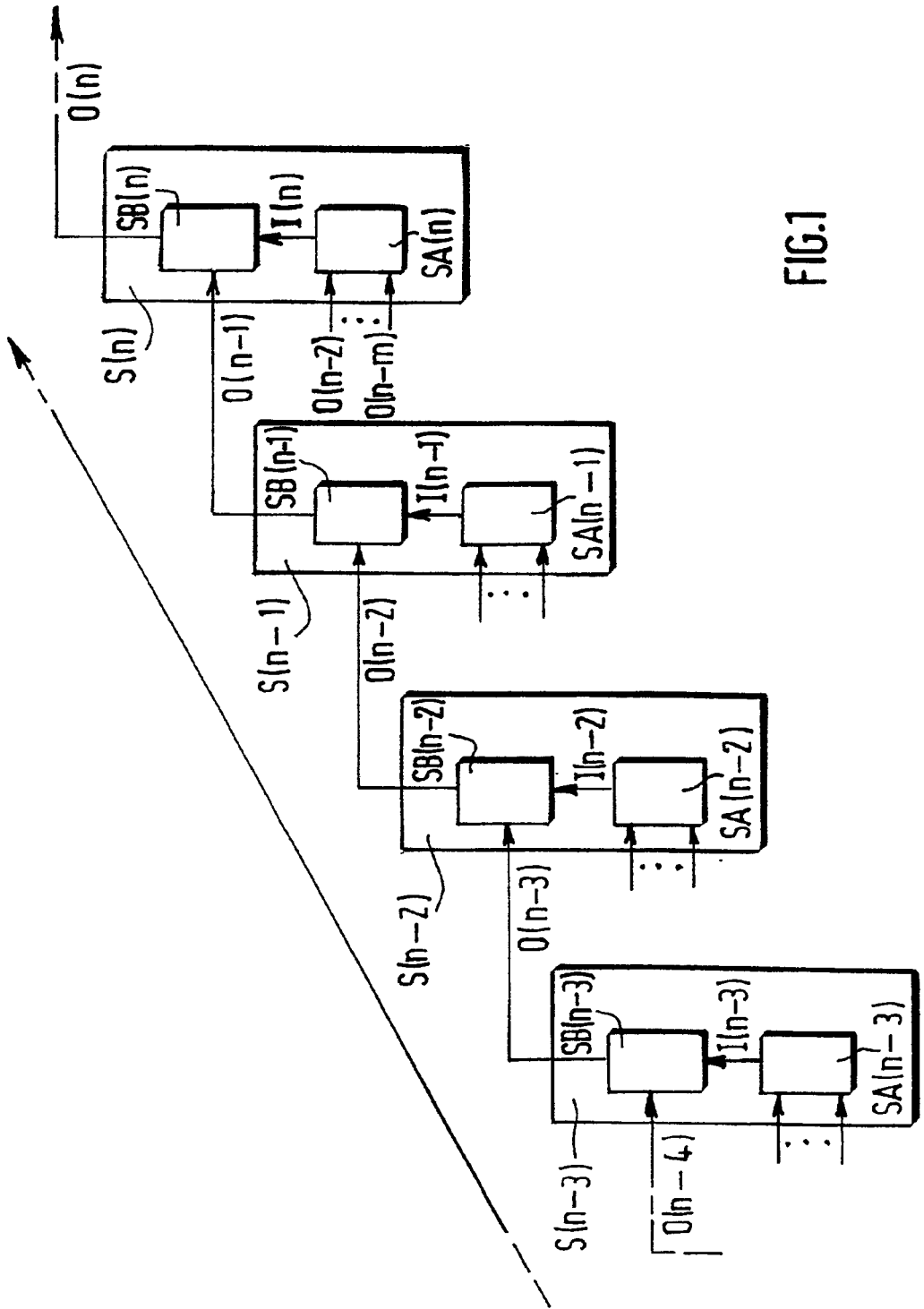
FIG. 1 is a conceptual diagram which illustrates the basic characteristic features described hereinbefore.

FIG. 1 illustrates the basic features described hereinbefore. Data processing is effected in a temporal series of processing steps [S]. A processing step [S(n)] generates a result [O(n)] on the basis of a set of results [O(n-1), O(n-2), ... O(n-m)] of certain preceding processing steps [S(n-1), S(n-2), ... S(n-m)]. A processing step [S] is carried out in two sub-steps: a preparation sub-step [SA] and a finishing sub-step [SB]. In the preparation sub-step [SA] an intermediate result [I] is determined on the basis of an incomplete set of results from which, in comparison with the set of results on the basis which the result is to be calculated, at least the result of the nearest preceding processing step is missing. In the finishing sub-step [SB] the result [O] is determined on the basis of the intermediate result [I] and the result of the nearest preceding processing step and other results which are missing in the incomplete set of results, if any.

The characteristic features shown in FIG. 1 may be used, for example, for performing a shape decoding in accordance with the MPEG4 standard. The shape decoding consists in determining a set of Boolean values associated with a set of pixels representing a certain object. There is a Boolean value for each pixel. The Boolean value indicates if the relevant pixel belongs to or does not belong to the object. As a matter of fact, the set of pixels is arranged in blocks of pixels during shape decoding. Each block of pixels is subjected to shape encoding in accordance with a certain mode of a plurality of possible shape encoding modes. A shape encoding mode corresponds to a contextual arithmetic encoding. This results in an arithmetic code for the relevant block of pixels.

The contextual arithmetic decoding consists in successively determining a Boolean value for each pixel of the block in the following manner. First of all, a context is determined for the relevant pixel. The context is formed by certain Boolean values already obtained for other pixels. For each pixel of the block the standard defines pixels whose Boolean values should be taken into account. Subsequently, a probability is determined on the basis of the context. The standard defines a probability for each possible context. Finally, the Boolean value is determined on the basis of the probability and the arithmetic code belonging to the relevant block of pixels. This last phase forms the heart of contextual arithmetic decoding. Thus, the contextual arithmetic decoding may be said to comprise three phases for each pixel: a "context" phase, a "probability" phase and a "decoding" phase.

Figure 2:
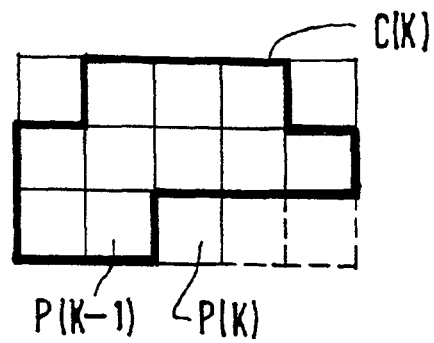
FIG. 2 is a conceptual diagram which shows a context for the contextual arithmetic encoding and decoding, forming part of the MPEG4 standard.

FIG. 2 shows a context [C(K)] for determining a Boolean value belonging to the pixel [P(K)]. Each square represents both a pixel and the associated Boolean value. It is assumed that the contextual arithmetic encoding requires a horizontal scan, row by row, from left to right and from top to bottom. The contextual arithmetic decoding requires the same scan. The context [C(K)] is composed of the Boolean value of the preceding pixel [P(K-1)] and certain other preceding pixels. It has already been stated that the MPEG4 standard defines a context for each pixel. FIG. 2 shows merely an example of the context In all cases the context, at the decoding level, is composed of a certain set of Boolean values already determined.

Figure 3:
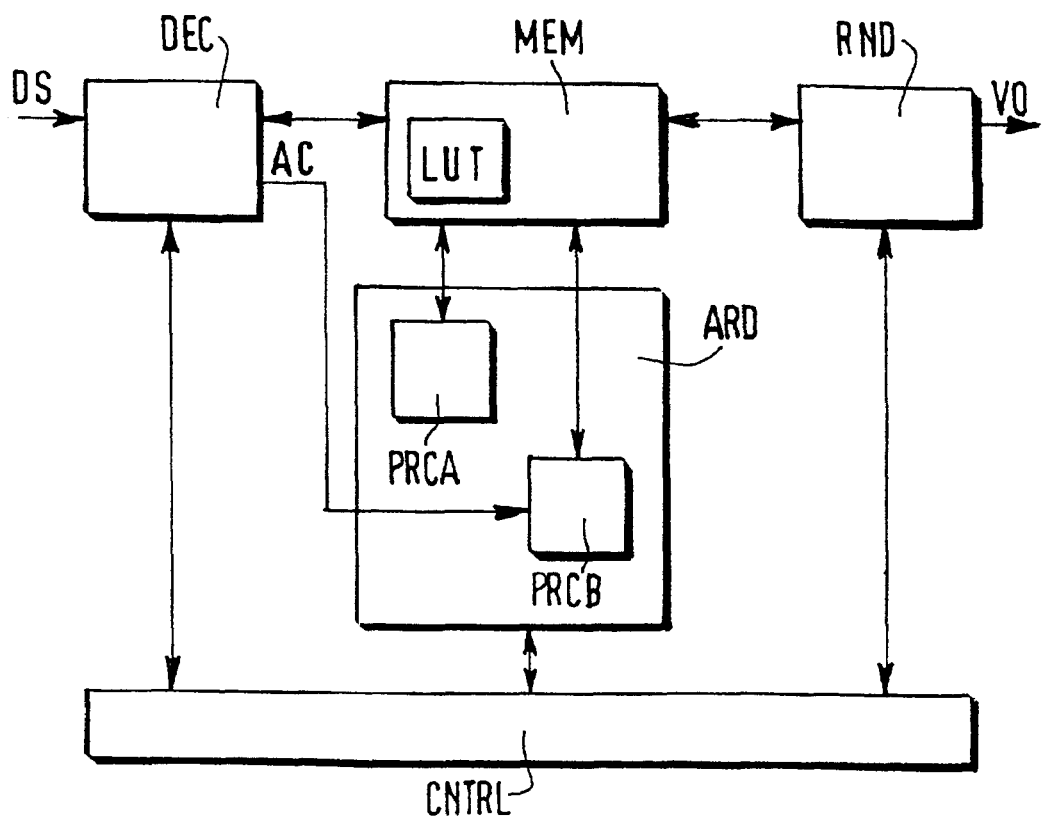
FIG. 3 is a block diagram which shows an MPEG4 data processing arrangement.

FIG. 3 shows an MPEG4 data processing arrangement. The arrangement receives a data stream [DS] encoded in accordance with the MPEG4 standard and, in response thereto, it supplies a stream of video data [VO] destined for a display device. The arrangement includes a main decoder [DEC], a contextual arithmetic decoder [ARD], an image renderer [RND], a memory device [MEM] and a controller [CNTRL]. The contextual arithmetic decoder [ARD] comprises a preparation processor [PRCA] and a finishing processor [PRCB]. The memory device [MEM] comprises a look-up table [LUT]. This table comprises the different contexts that are possible and, associated with each context, the probability belonging to it in accordance with the MPEG4 standard.

The MPEG data processing arrangement shown in FIG. 3 broadly operates as follows. The main decoder [DEC] inter alia derives blocks of 16 times 16 pixels from the data stream [DS]. Shape encoding of some of the blocks of 16 times 16 pixels has not been effected by means of an contextual arithmetic encoding. For these blocks of 16 times 16 pixels the main decoder [DEC] also derives a block of 16 times 16 Boolean values. On the other hand, the contextual arithmetic decoder [ARD] derives blocks of 16 times 16 Boolean values for the shape decoding of the blocks of 16 times 16 pixels whose shape encoding has been effected by means of contextual arithmetic encoding. The main decoder [DEC] supplies the arithmetic code [AC] on the basis of which the contextual arithmetic decoder [ARD] performs the contextual arithmetic decoding. Thus, the main decoder [DEC] performs all the decoding operations except the contextual arithmetic decoding. As a matter of fact, the main decoder [DEC] subcontracts this last-mentioned decoding to the contextual arithmetic decoder [ARD].

The blocks of 16 times 16 pixels from the main decoder [DEC] are temporarily stored in the memory device [MEM]. The blocks of 16 times 16 Boolean values from the main decoder [DEC] or the contextual arithmetic decoder [ARD] are also temporarily stored in the memory device [MEM]. The main decoder [DEC] derives from the data stream [DS] other information that is useful for carrying out other image decoding steps and finally supplies the images that are ready for rendering. This information is also temporarily stored in the memory device [MEM]. The image renderer [RND] renders an image to be displayed, which is effected on the basis of the different data stored in the memory device [MEM]. An image is typically composed of different objects, for example a house, a tree, a ball. The texture of an object is represented by a set of blocks of 16 times 16 pixels. The shape of the object is represented by a set of blocks of 16 times 16 Boolean values.

It has already been stated that the contextual arithmetic decoder [ARD] supplies the blocks of 16 times 16 Boolean values for the blocks of 16 times 16 pixels whose shape encoding has been effected by means of contextual arithmetic encoding. The contextual arithmetic decoder [ARD] performs contextual arithmetic decoding by means of the preparation processor [PRCA] and the finishing processor [PRCB]. These two processors operate in parallel under control of the controller [CNTRL]. The controller [CNTRL] determines for which pixel the preparation processor [PRCA] and the finishing processor [PRCB] respectively perform their operations. While the preparation processor [PRCA] performs the preparatory operations in order to determine the Boolean value belonging to the pixel numbered K, the finishing processor [PRCB] performs final operations in order to determine the Boolean value belonging to the pixel numbered K-1, K being an integer. The preparatory operations comprise the determination of two possible contexts and, subsequently, the determination of two probabilities which, in accordance with the standard, are associated with these contexts. The final operations comprise the selection of one of the two probabilities and the determination of a Boolean value on the basis of the selected probability and the code resulting from the contextual arithmetic encoding.

Figure 4:
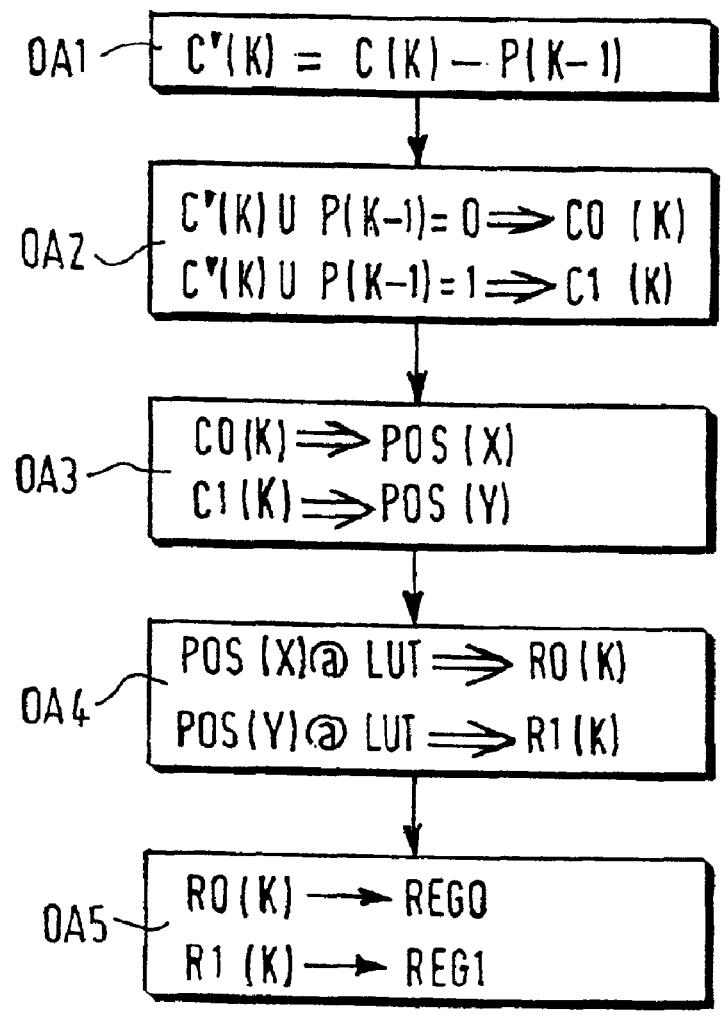
FIG. 4 is a flow chart which illustrates the operation of a preparation processor.

FIG. 4 shows different operations carried out by the preparation processor [PRCA]. A first operation [OA1] consists in forming a partial context [C'(K)] for the pixel numbered K. The partial context [C'(K)] is the set of Boolean values to be taken into account in accordance with the standard, with the exception of the Boolean value of the preceding Boolean value [P(K-1)]. This Boolean value [P(K-1)] is not yet available; it is subjected to operations executed in parallel by the finishing processor [PRCB]. The formation of the partial context [C'(K)] requires read-outs of the memory device [MEM] which stores the Boolean values already obtained.

A second operation [OA2] consists in forming two possible contexts on the basis of the partial context [C'(K)]. A first possible context [C0(K)] corresponds to the partial context [C'(K)] to which the value zero (0) has been added as the Boolean value of the preceding pixel P(K-1). A second possible context [C(K)] corresponds to the partial context [C'(K)] to which the value one (1) has been added as the Boolean value of the preceding pixel P(K-1). Thus, the first possible context [C0(K)] will be the correct context for determining the Boolean value belonging to the current pixel [P(K)] if the Boolean value of the preceding pixel [P(K-1)] is zero (0). On the other hand, the second possible context [C1(K)] will be the correct context if the Boolean value of the preceding pixel [P(K-1)] is one (1).

A third operation [OA3] is to determine which position in the look-up table [LUT] corresponds to the first possible context [CO(K)] and which position corresponds to the second possible context [C1(K)]. Actually, the possible contexts are converted into addresses. Such a conversion can be performed by means of, for example, a combination of logic circuits.

A fourth operation [OA4] is to read the relevant positions from the look-up table [LUT]. This results in two possible probabilities: a first possible probability [R0(K)] which, in accordance with the standard, belongs to the first possible context [CO(K)], and a second possible probability [R1(K)] which belongs to the second possible context [CO(K)]. The first possible probability [C0(K)] will be the correct probability to determine the Boolean value belonging to the current pixel [P(K)] if the Boolean value of the preceding pixel P(K-1) is zero (0). On the other hand, the second possible probability [C1(K)] will be the correct probability to determine the correct probability if the Boolean value of the preceding pixel P(K-1) is one (1).

It is advantageous to implement the look-up table [LUT] in the form of two half-table: one half-table that contains the probabilities corresponding to contexts for which the Boolean value of the last pixel is zero (0) and another half-table that contains the probabilities corresponding to contexts for which the Boolean value of the last pixel is one (1). Such an implementation enables the first possible probability [R0(K)]and the second possible probability [R1 (K)] to be read in parallel.

A fifth operation [OA5] is to write the first and the second possible probability into a predefined first storage element and second storage element, respectively. Thus, the first storage element will contain the correct probability if the Boolean value of the preceding pixel P(K-1) is zero (0). Conversely, the second storage element will contain the correct probability if the Boolean value of the preceding pixel [P(K-1)] is one (1).

Figure 5:
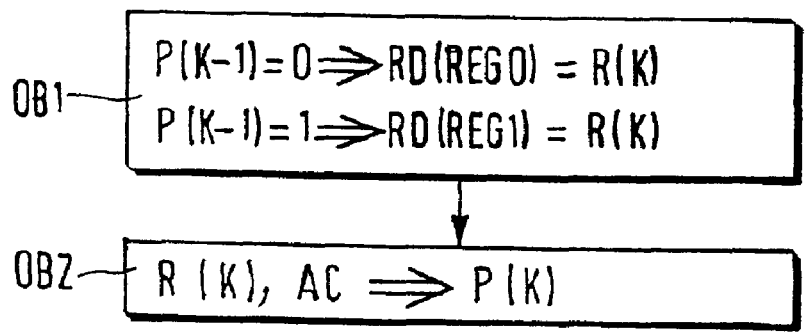
FIG. 5 is a flow chart which illustrates the operation of a finishing processor.

FIG. 5 shows different operations performed by the finishing processor [PRCB]. It is assumed that the finishing processor [PRCB] has calculated the Boolean value of the preceding pixel [P(K-1)]. A first operation [OB1] consists in reading out either the first storage element or the second storage element. The finishing processor [PRCB] reads out the first storage element if the Boolean value of the preceding pixel [P(K-1)] is zero (0). Conversely, the finishing processor [PRCB] reads out the second storage element if the Boolean value of the preceding pixel [P(K-1)] is one (1). Thus, the correct probability is obtained in order to determine the Boolean value belonging to the current pixel [P(K)].

A second operation [OB2] consists in calculating the Boolean value belonging to the current pixel [P(K)]. The finishing processor [PRCB] performs this calculation on the basis of the probability determined by the first operation [OB1 ] and the arithmetic code for the relevant block of pixels.

The MPEG4 data processing arrangement described with reference to FIGS. 2–5 is an example of realizing the characteristic features illustrated in FIG. 1. A result of a processing step [O] illustrated in FIG. 1 takes the form of a Boolean value determined for a pixel [P] illustrated in FIG. 2. An intermediate result [I] illustrated in FIG. 1 takes the form of the two possible probabilities [R0(K), R1(K)] shown in FIG. 4. The preparation processor [PRCA] shown in FIG. 3 determines two possible probabilities on the basis of a partial context in which, as compared with the context on the basis of which a Boolean value is to be calculated, the Boolean value belonging to the preceding pixel is missing. The finishing processor [PRCB] shown in FIG. 3 determines a Boolean value on the basis of the two possible probabilities and the Boolean value belonging to the preceding pixel.

The above description with reference to FIGS. 1 to 5 illustrates rather than limits the invention. It is evident that there are numerous alternatives within the scope of the appended Claims. In conclusion, some remarks are made in this respect.

There are numerous methods of carrying out a processing step by performing a preparation sub-step and a finishing sub-step in accordance with the invention. In this respect, the MPEG4 processing arrangement described with reference to FIGS. 2 to 5 has the following characteristic feature. The preparation step takes into account all the results necessary for determining a new result, except for the result of the preceding step. Consequently, the finishing step takes into account the intermediate result provided by the preparation step and the result of the preceding step. It is also possible to implement the invention in the following manner. The preparation step does not take into account several results necessary for determining a new result. For example, another manner of carrying out a contextual arithmetic decoding is as follows. A preparation processor does not take into account the Boolean values belonging to the last and the last but one pixel. Such a preparation processor determines four possible probabilities: a first, a second, a third and a fourth possible probability associated with the possibility that the Boolean values belonging to the last and the last but one pixel are 00, 01, 10 or 11, respectively. A finishing processor selects a possible probability from the actually determined Boolean values in order to determine the Boolean value for the current pixel.

There are numerous ways of implementing functions by means of items of hardware or software or a combination of the two. In this respect, it is to be noted that the figures are highly diagrammatic, each Figure representing merely a single embodiment of the invention. Thus, although a Figure shows different functions as separate blocks, this does not exclude the possibility that a single item of hardware or software performs a plurality of functions. This by no means excludes the possibility that a function may be carried out by a set of hardware or software items.

For example, the MPEG4 processing arrangement shown in FIG. 3 comprises different blocks which, in combination, perform a contextual arithmetic decoding. In principle, it is possible to realize these blocks by means of a suitably programmed computer circuit. A set of instructions contained in a program memory can cause the computer circuit to carry out the different operations described hereinbefore with reference to FIGS. 2–5. The set of instructions can be loaded into the program memory by reading a data carrier, for example a disc which carries the set of instructions. Reading may be effected via a communication network such as, for example, the internet. In this case, a service provider will make the set of instructions available to those interested.

Any reference signs given in parentheses in a claim shall not be construed as limiting said claim. The use of the verb "to comprise" does not exclude the presence of any other elements or steps other than those defined in a claim. The use of the indefinite article "a" or "an" preceding an element or step does not exclude the presence of a plurality of these elements or steps .

What is claimed is:

1. A method of processing a temporal series of processing steps in a computer system, wherein each processing step generating a result on the basis of a set of results of certain preceding processing steps comprises the steps of:, a preparation sub-step in which an intermediate result is determined on the basis of an incomplete set of results in which, in comparison with the set of results on the basis of which the result is to be calculated, at least the result of the nearest preceding processing step is missing, and a finishing sub-step in which the result is determined on the basis of the intermediate result and of the result of the nearest preceding processing step and other results which are missing in the incomplete set of results.

2. A data processing arrangement for carrying out a temporal series of processing steps, wherein a processing step generating a result on the basis of a set of results of certain preceding processing steps, which arrangement is adapted to carry out the processing step by means of two processors comprising:

a preparation processing for determining an intermediate result on the basis of an incomplete set of results in which, in comparison with the set of results on the basis of which the result is to be calculated, at least the result of the nearest preceding processing step is missing, and a finishing processor for determining the result on the basis of the intermediate result and of the result of the nearest preceding processing step and other results which are missing in the incomplete set of results.

3. A computer implemented program product for a data processing arrangement, the "computer program" product comprising a set of instructions which, when implemented, causes the data processing arrangement to carry out a temporal series of processing a processing step being performed in two sub-steps:

a preparation sub-step in which an intermediate result is determined on the basis of an incomplete set of results in which, in comparison with the set of results on the basis of which the result is to be calculated, at least the result of the nearest preceding processing step is missing, and a finishing sub-step in which the result is determined on the basis of the intermediate result and of the result of the nearest preceding processing step and other results which are missing in the incomplete set of results.

4. A method of shape decoding in the form of a temporal series of decoding steps in a computer system, wherein a decoding step generating a Boolean value on the basis of a set of Boolean values of certain preceding decoding steps, comprising the steps of:

a preparation sub-step in which a set of possible probabilities is determined on the basis of an incomplete set of Boolean values in which, in comparison with the set of Boolean values on the basis of which the Boolean value is to be calculated, at least the Boolean value of the nearest preceding decoding step is missing, and a finishing sub-step in which the Boolean value is determined on the basis of the set of Boolean values and of the Boolean value of the nearest preceding decoding step and other Boolean values which are missing in the incomplete set of Boolean values.

* * * * *